US010037891B2

(12) United States Patent
Okita et al.

(10) Patent No.: US 10,037,891 B2
(45) Date of Patent: Jul. 31, 2018

(54) MANUFACTURING METHOD OF ELEMENT CHIP

(71) Applicant: Panasonic Intellectual Property Management Co., Ltd., Osaka (JP)

(72) Inventors: Shogo Okita, Hyogo (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 48 days.

(21) Appl. No.: 15/427,561

(22) Filed: Feb. 8, 2017

(65) Prior Publication Data

US 2017/0263462 A1    Sep. 14, 2017

(30) Foreign Application Priority Data

Mar. 9, 2016  (JP) ................................ 2016-046339

(51) Int. Cl.
| | |
|---|---|
| H01L 21/00 | (2006.01) |
| H01L 21/3065 | (2006.01) |
| H01L 21/78 | (2006.01) |
| H01L 23/544 | (2006.01) |
| H01L 21/311 | (2006.01) |
| H01L 21/67 | (2006.01) |
| H01L 21/683 | (2006.01) |
| H01L 21/687 | (2006.01) |

(52) U.S. Cl.
CPC .... *H01L 21/3065* (2013.01); *H01L 21/30655* (2013.01); *H01L 21/31138* (2013.01); *H01L 21/67109* (2013.01); *H01L 21/67115* (2013.01); *H01L 21/6831* (2013.01); *H01L 21/68742* (2013.01); *H01L 21/68785* (2013.01); *H01L 21/78* (2013.01); *H01L 23/544* (2013.01); *H01L 2223/5446* (2013.01)

(58) Field of Classification Search
CPC ....................... H01C 17/2404; H01L 21/3065
See application file for complete search history.

(56) References Cited

U.S. PATENT DOCUMENTS

2013/0230974 A1* 9/2013 Martinez ........... H01L 21/68771
  438/464
2014/0213041 A1* 7/2014 Lei ........................ H01L 21/78
  438/462

FOREIGN PATENT DOCUMENTS

WO    2012/164857 A1    12/2012

* cited by examiner

*Primary Examiner* — Julio J Maldonado
*Assistant Examiner* — Andre' C Stevenon
(74) *Attorney, Agent, or Firm* — Pearne & Gordon LLP (57) ABSTRACT

A manufacturing method of an element chip includes a preparation process of adhering a holding sheet to the first main surface of a substrate so as to prepare the substrate held by the holding sheet, a plasma dicing process of performing plasma etching on the isolation region of the substrate to the first main surface so as to divide the substrate into the plurality of element chips. The plasma dicing process includes a first plasma etching process of performing plasma etching on a the isolation region partially in a thickness direction while a cooling gas is supplied between the stage and the holding sheet, and a second plasma etching process of stopping a supply of the cooling gas after the first plasma etching process, and performing plasma etching on a remaining portion of the isolation region.

6 Claims, 8 Drawing Sheets

MANUFACTURING METHOD OF ELEMENT CHIP

BACKGROUND

1. Technical Field

The disclosure relates to a method of manufacturing an element chip from a substrate held by a holding sheet.

2. Description of the Related Art

As a method of dicing a substrate which includes a plurality of element regions demarcated by an isolation region, plasma dicing in which the isolation region is subjected to plasma etching so as to divide the substrate into a plurality of element chips is known. Recently, an electronic device has a reduced size and a reduced thickness, and thus the thickness of an IC chip and the like mounted in the electronic device is reduced. With this trend, the thickness of a substrate for forming an IC chip and the like as a target of plasma dicing is also reduced, and thus the substrate is easily bent.

Patent Literature 1 discloses that a substrate in a state of being held in a transporting carrier which includes a frame and a holding sheet for covering an opening portion of the frame is placed on a stage included in a plasma treatment apparatus and plasma dicing is performed, in order to improve handling characteristics of the substrate or an element chip during transporting or picking-up. In a case using a holding sheet, if the temperature of the holding sheet becomes high, the holding sheet is, for example, stretched or damages. Thus, a divided element chip is fallen or picking an element chip up from the holding sheet is difficult. Thus, the stage includes an electrostatic suction mechanism for sticking a holding sheet and the state is cooled. A holding sheet is electrostatically sucked to the cooled stage, and thus the holding sheet in the process of plasma treatment is also cooled.

CITATION LIST

Patent Literature

PTL 1: Pamphlet of PCT International Publication No. WO2012/164857

SUMMARY

In a case where a substrate including a circuit layer which includes an insulating film is subjected to plasma dicing in a state of being held by a holding sheet, large high-frequency power is applied to a high-frequency electrode buried in a stage, and thus plasma treatment is performed while a high bias voltage is applied. Thus, it is possible to increase an etching rate and to improve the throughput. If a high bias voltage is applied, the temperature of the holding sheet easily becomes high. Therefore, from a viewpoint of improving the throughput, it is necessary that the holding sheet is cooled during plasma treatment, with high efficiency.

In a case where a treatment target is not a substrate held by the holding sheet, but a single substrate having a sufficient thickness, in order to improve cooling efficiency of a substrate, a substrate may be electrostatically suck to the stage, and a heat transfer gas of helium (He) and the like as a cooling gas may be supplied to a space between the substrate and stage, from a gas hole provided in the surface of the stage. At this time, pressure of the heat transfer gas supplied to the space between the substrate and the stage is increased, and thus cooling efficiency of the substrate is more improved.

However, in a case using the holding sheet, it may be difficult that the pressure of the heat transfer gas supplied to the space between the stage and the holding sheet is increased. This is because an electrostatic suction force of the holding sheet to the stage is weaker than an electrostatic suction force of the single substrate to the stage. In addition, if the thickness of an isolation region in a substrate is reduced while plasma etching is in progress, it is difficult for the substrate to maintain a flat shape. Thus, pressure of the heat transfer gas from the stage side via the holding sheet causes the substrate to float up from the stage along with the holding sheet at the isolation region as a starting point. If the substrate floats up from the stage, troubles such as abnormality of a processed shape or abnormal discharge easily occur. In addition, adhesiveness between the holding sheet and the stage is degraded, and thus sufficiently cooling the holding sheet is not possible.

In a case of performing plasma dicing, there is a problem in that the electrostatic suction force easily becomes unstable. Generally, as an electrode for electrostatic suction (referred to as an ESC electrode below) used in electrostatic suction, there are an ESC electrode using the Johnsen-Rahbeck force, and an ESC electrode using the Coulomb force. In plasma dicing, the substrate is required to be sucked to the stage via the holding sheet. As in a case where the holding sheet has insulating properties, in a case where working of the Johnsen-Rahbeck force is difficult, an ESC electrode using the Coulomb force is preferably used.

In a case of an ESC electrode using the Coulomb force, an electrostatic suction force is generated between charges charged on the surface of the substrate and the holding sheet, and the ESC electrode provided in the stage. In plasma dicing, the substrate is divided into element chips on the holding sheet. At this time, variation occurs in the surface of the substrate by an influence of film thickness distribution of the substrate, distribution of plasma, and the like. The variation occurs at a timing when dividing is performed. Thus, if dividing of the substrate is started in the process of plasma dicing, in-plane distribution of charges charged on the front surface of the substrate becomes un-uniform, and thus the electrostatic suction force easily becomes unstable.

In a case of an ESC electrode using the Johnsen-Rahbeck force, a minute current flows in the holding sheet and the substrate, and thus electrostatic suction is performed. Even in this case, in the plasma dicing, when the substrate is divided into element chips, a path of a minute current which flows in the back surface of the substrate via the holding sheet is changed. Thus, before and after the substrate is divided, the electrostatic suction force easily becomes unstable.

As described above, in plasma dicing of dividing the substrate by plasma treatment, there is a problem in that an electrostatic suction force easily becomes unstable before and after dividing. Thus, introducing a heat transfer gas between the stage and the holding sheet is difficult.

According to an aspect of the disclosure, there is provided a manufacturing method of an element chip, which is used for dividing a substrate which includes a first main surface and a second main surface on an opposite side, and includes a plurality of element regions demarcated by an isolation region, by the isolation region, so as to form a plurality of element chips. The method includes a preparation process, a placing process, and a plasma dicing process. In the preparation process, the first main surface is adhered to a holding sheet so as to prepare a substrate held by the holding sheet. In the placing process, the holding sheet which holds the substrate is placed on a stage provided in a plasma treatment apparatus. In the plasma dicing process, the isolation region of the substrate is subjected to plasma etching from the second main surface to the first main surface, so as to divide the substrate into the plurality of element chips. Further, the plasma dicing process includes a first plasma etching process and a second plasma etching process which is a process subsequent to the first plasma etching process. In the first plasma etching process, the isolation region is subjected to plasma etching partially in a thickness direction while a cooling gas is supplied between the stage and the holding sheet. In the second plasma etching process, after the first plasma etching process, a supply of the cooling gas is stopped and the remaining portion of the isolation region is subjected to plasma etching.

According to the disclosure, when a substrate held by a holding sheet is subjected to plasma treatment, the holding sheet can be efficiently cooled by using a cooling gas while floating of the substrate from the stage is suppressed. Thus, throughput and yield of products is improved.

DETAILED DESCRIPTIONS

In exemplary embodiments, considering the thickness of an isolation region of a substrate, a cooling gas is supplied between a stage and a holding sheet. That is, plasma etching is performed with efficiently cooling the holding sheet by the cooling gas, during a period from the beginning of a plasma dicing process until floating of the holding sheet is easily caused. Supplying the cooling gas is stopped and plasma etching is performed in a state where floating of the holding sheet is easily caused, in the last of the plasma dicing process. Thus, it is possible to high-efficiently perform plasma dicing without damaging the holding sheet, while an occurrence of a phenomenon in which the holding sheet floats up by the cooling gas is suppressed.

That is, a manufacturing method of an element chip according to the exemplary embodiments is a method of dividing a substrate by an isolation region so as to form a plurality of element chips. The substrate includes a first main surface and a second main surface on an opposite side of the first main surface, and includes a plurality of element regions demarcated by the isolation region. The manufacturing method of an element chip includes a preparation process, a placing process, and a plasma dicing process. In the preparation process, the first main surface is adhered to a holding sheet so as to prepare a substrate held by the holding sheet. In the placing process, the holding sheet which holds the substrate is placed on a stage provided in a plasma treatment apparatus. In the plasma dicing process, the isolation region of the substrate is subjected to plasma etching from the second main surface to the first main surface, so as to divide the substrate into the plurality of element chips. The plasma dicing process includes a first plasma etching process and a second plasma etching process which is a process subsequent to first plasma etching process. In the first plasma etching process, the isolation region is subjected to plasma etching partially in a thickness direction while a cooling gas is supplied between the stage and the holding sheet. In the second plasma etching process, a supply of the cooling gas is stopped, and the remaining portion of the isolation region is subjected to plasma etching.

The plasma dicing process may be performed in a state where high frequency power (bias voltage) is applied to the stage. At this time, a bias voltage higher than that in the second plasma etching process may be applied in the first plasma etching process in which plasma etching is performed with supplying the cooling gas. Thus, an etching rate in the first plasma etching process is increased, and throughput is improved. This method is particularly advantageous in a case where the substrate includes an insulating film or a metal material. This is because, generally plasma treatment is performed with applying a high bias voltage, in a case where the substrate includes an insulating film or a metal material, from a viewpoint of increasing a speed of treatment.

Figure 1A:
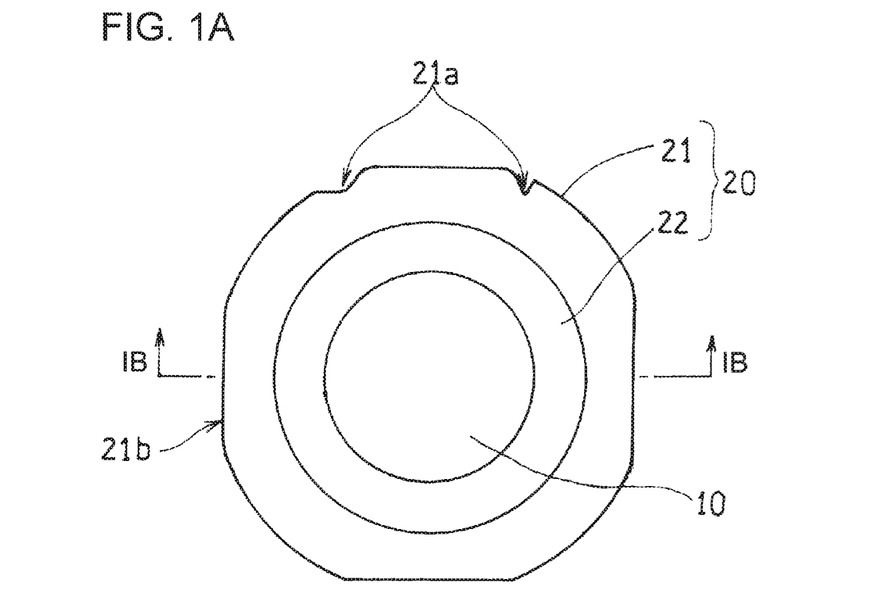
FIG. 1A is a top view schematically illustrating a transporting carrier which holds a substrate according to an exemplary embodiment of the disclosure.
Figure 1B:
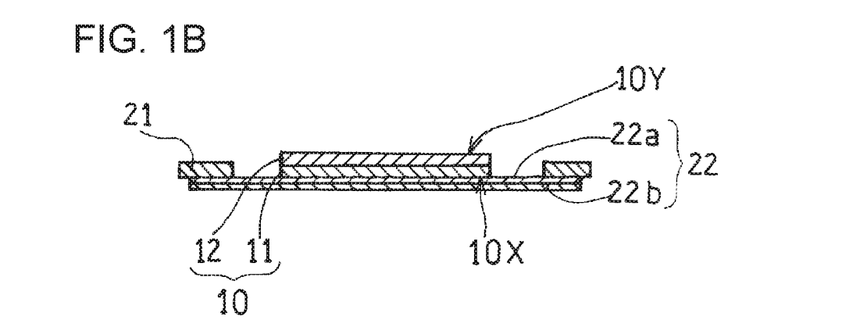
FIG. 1B is a sectional view taken along line IB-IB line in FIG. 1A.

Firstly, an exemplary embodiment of a transporting carrier used in the disclosure will be described with reference to FIGS. 1A and 1B. FIG. 1A is a top vie schematically illustrating substrate 10 and transporting carrier 20 which holds substrate 10. FIG. 1B is a sectional view of substrate 10 and transporting carrier 20 taken along line IB-IB illustrated in FIG. 1A. FIGS. 1A and 1B illustrate a case where both of frame 21 and substrate 10 are substantially circular. However, it is not limited thereto.

Substrate

Figure 3A:
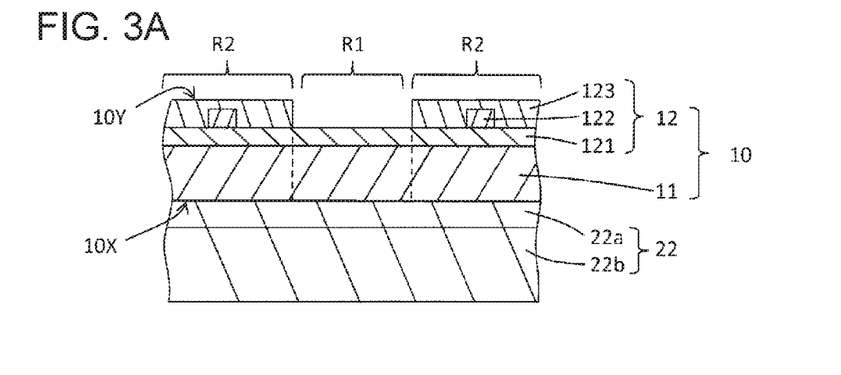
FIG. 3A is a sectional view illustrating some of processes of a plasma treatment method according to a first exemplary embodiment of the disclosure.

Substrate 10 is a target of plasma treatment and is subdivided into isolation region R1 and a plurality of element regions R2 demarcated by isolation region R1 (see FIG. 3A).

Substrate 10 includes main body layer 11 and circuit layer 12 in which, for example, a semiconductor circuit, an electronic component element, MEMS, and the like is provided. Isolation region R1 of substrate 10 is etched, and thus element chip 110 (see FIGS. 3A to 3C) including circuit layer 12 is obtained.

Main body layer 11 is a semiconductor layer formed of, for example, silicon (Si), gallium arsenide (GaAs), gallium nitride (GaN), silicon carbide (SiC). Circuit layer 12 includes at least an insulating film. In addition, circuit layer 12 may include a metal material, a resin protective layer (for example, polyimide), a resist layer, an electrode pad, a bump, and the like. The insulating film may be included as a laminated body (multilayer wiring layer) with a metal material for wiring. The insulating film includes, for example, a resin film of polyimide and the like, silicon dioxide ($SiO_2$), silicon nitride ($Si_3N_4$), a low-dielectric constant film (Low-k film), lithium tantalate ($LiTaO_3$), and lithium niobate ($LiNbO_3$).

The thickness of main body layer 11 is not particularly limited. For example, the thickness of main body layer 11 may be 20 to 1000 μm, or may be 100 to 300 μm. The thickness of the insulating film is also not particularly limited, and is 2 to 10 μm, for example. The thickness of the multilayer wiring layer is also not particularly limited, and is 2 to 10 μm, for example. The thickness of the resist layer is also not particularly limited, and is 5 to 20 μm, for example. The size of substrate 10 is also not particularly limited, and has the maximum diameter of about 50 mm to 300 mm, for example. The shape of substrate 10 is also not particularly limited, and is, for example, circular or a square type. An orientation flat or a notch (none illustrated) may be provided in substrate 10.

Back metal layer 13 (see FIG. 7A) may be disposed on an opposite side of circuit layer 12 of main body layer 11. Back metal layer 13 is disposed, for example, in a case where obtained element chip 110 is a power device. Back metal layer 13 contains, for example, gold (Au), nickel (Ni), titanium (Ti), aluminium (Al), tin (Sn), silver (Ag), platinum (Pt), and palladium (Pd). The substances may be singly used or may be used in combination of two or more types. Back metal layer 13 may be, for example, a single layer which contains singly the above-described metals, or may be a laminated body of a layer which contains singly the above-described metals. The thickness of back metal layer 13 is not particularly limited, and is 0.5 to 1.5 μm, for example.

Holding Sheet

The material of holding sheet 22 is not particularly limited. Among substances, holding sheet 22 preferably includes adhesive layer 22a and resin film 22b having flexibility, from a point of causing substrate 10 to be easily adhered to holding sheet 22. In this case, from a viewpoint of handling characteristics, holding sheet 22 is fixed to frame 21. Frame 21 and holding sheet 22 fixed to frame 21 are collectively referred to as transporting carrier 20 below.

The material of resin film 22b is not particularly limited. For example, thermoplastic resin of, for example, polyolefin (such as polyethylene and polypropylene) and polyester (such as polyethylene terephthalate) is exemplified. Various additives such as a rubber component, a plasticizer, a softening agent, and an antioxidant may be mixed with the resin film. The rubber component (for example, ethylene-propylene rubber (EPM) and ethylene-propylene-diene rubber (EPDM)) is used for adding elasticity. The thermoplastic resin may have a functional group such as an acrylic group, which shows a photopolymerization reaction. The thickness of resin film 22b is not particularly limited. The thickness of resin film 22b is, for example, 50 to 300 μm, and preferably 50 to 150 μm.

An outer circumferential edge of adhesive layer 22a adheres to one surface of frame 21, and thus covers an opening of frame 21. One main surface (first main surface 10X) of substrate 10 is adhered to a portion which is exposed from the opening of frame 21 of adhesive layer 22a, so as to be supported. In plasma treatment, holding sheet 22 is placed on a stage so as to bring resin film 22b into contact with the stage installed in the plasma treatment apparatus. That is, plasma etching is performed from a main surface (second main surface 10Y) side which is opposite to first main surface 10X.

Adhesive layer 22a is preferably formed from an adhesive component of which an adhesive force is reduced by irradiation with an ultraviolet ray (UV). Thus, when element chip 110 is picked up after the plasma dicing, UV irradiation is performed and thus element chip 110 is easily separated from adhesive layer 22a, and is easily picked up. For example, adhesive layer 22a is obtained in such a manner that an UV curable acrylic adhesive agent is applied onto a single surface of resin film 22b so as to have a thickness of 5 to 100 μm (preferably 5 to 15 μm).

Frame

Frame 21 has an opening having an area which is the same or more than that of the entirety of substrate 10. Frame 21 has a predetermined width and a substantially constant thin thickness. Frame 21 has hardness having an extent of being enabled to be transported in a state of holding holding sheet 22 and substrate 10. The shape of the opening of frame 21 is not particularly limited, and may be polygonal shape such as a circular shape, a rectangular shape, and a hexagonal shape. Notch 21a and corner cut 21b for positioning may be provided in frame 21. Examples of the material of frame 21 include metal such as aluminum and stainless steel, and resin.

Plasma Treatment Apparatus

Figure 2:
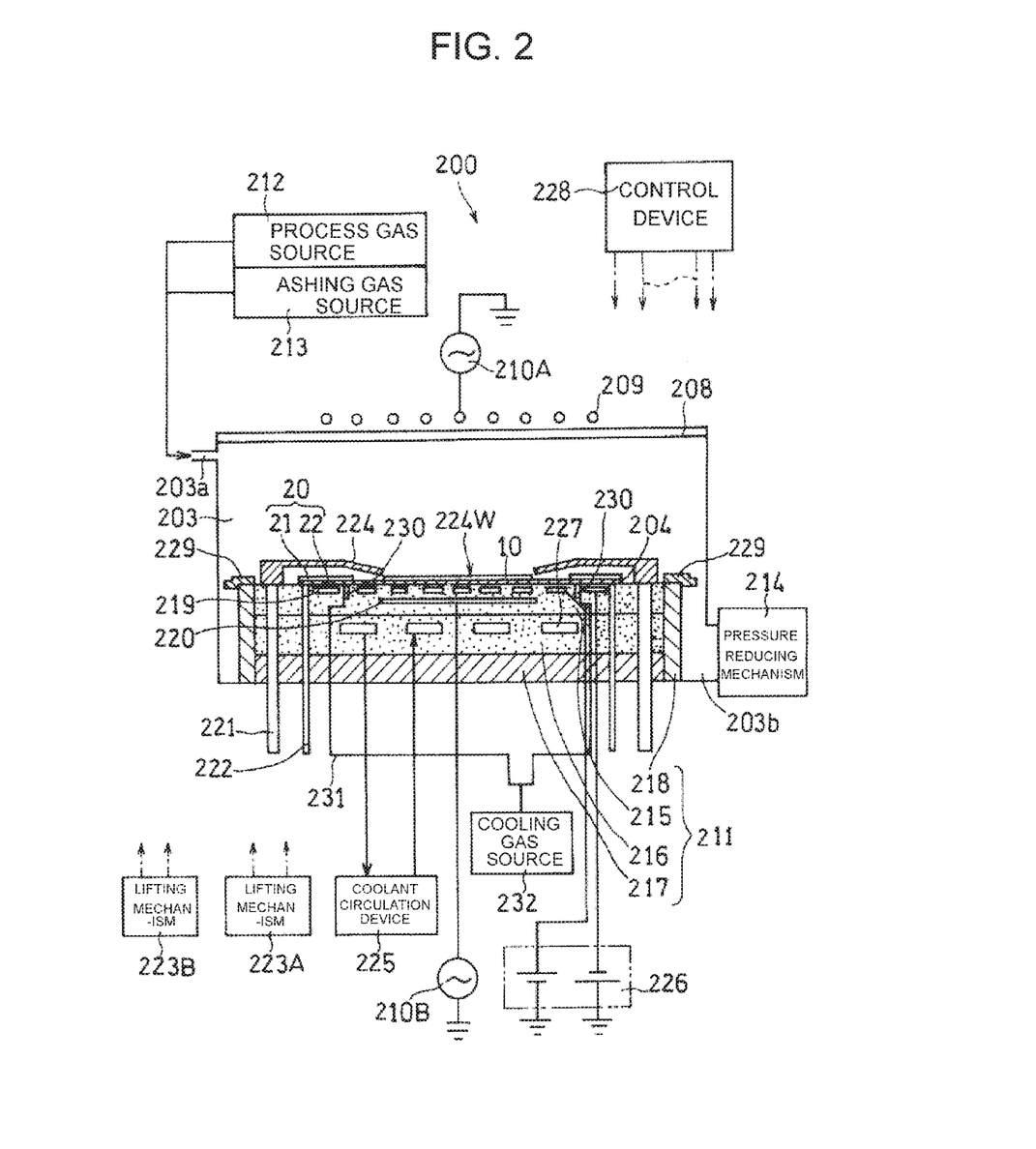
FIG. 2 is a conceptual diagram illustrating a section of a schematic structure of a plasma treatment apparatus according to the exemplary embodiment of the disclosure.

Next, a structure of plasma treatment apparatus 200 according to an exemplary embodiment of the disclosure will be described with reference to FIG. 2. FIG. 2 schematically illustrates a section of the structure of plasma treatment apparatus 200.

Plasma treatment apparatus 200 includes stage 211. Transporting carrier 20 is mounted on stage 211 so as to cause a surface of holding sheet 22, which holds substrate 10 to be directed upwardly. Stage 211 has a size of an extent of being allowed to placing the entirety of transporting carrier 20 thereon. Cover 224 is disposed over stage 211. Cover 224 covers frame 21 and at least a portion of holding sheet 22, and includes window portion 224W for exposing at least a portion of substrate 10.

Stage 211 and cover 224 are disposed in a treatment chamber (vacuum chamber 203). Vacuum chamber 203 has a substantially cylindrical shape of which an upper portion is opened, and the upper opening is closed by dielectric member 208 which is a lid. As a material forming vacuum chamber 203, aluminium, stainless steel (SUS), and aluminium of which a surface is alumite-processed may be exemplified. As a material forming dielectric member 208, a dielectric material such as yttrium oxide ($Y_2O_3$), aluminum nitride (AlN), alumina ($Al_2O_3$), and quartz ($SiO_2$) may be exemplified. Antenna 209 as an upper electrode is disposed over dielectric member 208. Antenna 209 is electrically connected to first high-frequency power source 210A. Stage 211 is disposed on the bottom side of vacuum chamber 203.

Gas introduction port 203a is connected to vacuum chamber 203. Process gas source 212 and ashing gas source 213 which are supplying sources of gases for plasma generation are connected to gas introduction port 203a by pipes, respectively. Exhaust port 203b is provided in vacuum chamber 203. Pressure reducing mechanism 214 which includes a vacuum pump for exhausting a gas in vacuum chamber 203 so as to reduce pressure is connected to exhaust port 203b.

Stage 211 includes electrode layer 215, metal layer 216, base 217, electrode layer 215, and outer circumferential portion 218 which are substantially circular. Base 217 supports electrode layer 215 and metal layer 216. Outer circumferential portion 218 surrounds metal layer 216 and base 217. Outer circumferential portion 218 is configured by metal having conductivity and etching resistance. Outer circumferential portion 218 protects electrode layer 215, metal layer 216, and base 217 from plasma. Annular outer circumference ring 229 is disposed on an upper surface of outer circumferential portion 218. Outer circumference ring 229 has a function of protecting the upper surface of outer circumferential portion 218 from plasma. Electrode layer 215 and outer circumference ring 229 are configured by, for example, a dielectric material.

ESC electrode 219 and high-frequency electrode portion 220 are disposed in electrode layer 215. ESC electrode 219 constitutes an electrostatic suction mechanism. High-frequency electrode portion 220 is electrically connected to second high-frequency power source 210B. DC power source 226 is electrically connected to ESC electrode 219. The electrostatic suction mechanism is configured by ESC electrode 219 and DC power source 226. The electrostatic suction mechanism causes holding sheet 22 to be sucked to stage 211.

Metal layer 216 is configured by, for example, aluminium of which alumite coating is formed on the surface. Coolant flow passage 227 is formed in metal layer 216. Coolant flow passage 227 causes stage 211 to be cooled. Cooling stage 211 causes holding sheet 22 mounted on stage 211 to be cooled and causes cover 224 of which a portion is in contact with stage 211 to be also cooled. A coolant in coolant flow passage 227 is circulated by coolant circulation device 225.

A plurality of supports 222 which penetrate stage 211 is arranged in the vicinity of an outer circumference of stage 211. Support 222 is driven by lifting mechanism 223A, so as to be lifted. If transporting carrier 20 is transported into vacuum chamber 203, transporting carrier 20 is delivered to support 222 which is lifted up to a predetermined position. Support 222 supports frame 21 of transporting carrier 20. An upper end surface of support 222 is lifted down up to a level (which is the same level as that of stage 211) or lower, and thus transporting carrier 20 is mounted at a predetermined position of stage 211.

A plurality of lifting rods 221 is joined to an end portion of cover 224, and thus may lift cover 224 up and down. Lifting rod 221 is driven by lifting mechanism 223B, so as to be lifted. An operation of lifting mechanism 223B lifting cover 224 may be performed separately from that of lifting mechanism 223A.

Control device 228 controls operations of components constituting plasma treatment apparatus 200 which includes the first high-frequency power source 210A, second high-frequency power source 210B, process gas source 212, ashing gas source 213, pressure reducing mechanism 214, coolant circulation device 225, lifting mechanism 223A, lifting mechanism 223B, and electrostatic suction mechanism.

First Exemplary Embodiment

Figure 3B:
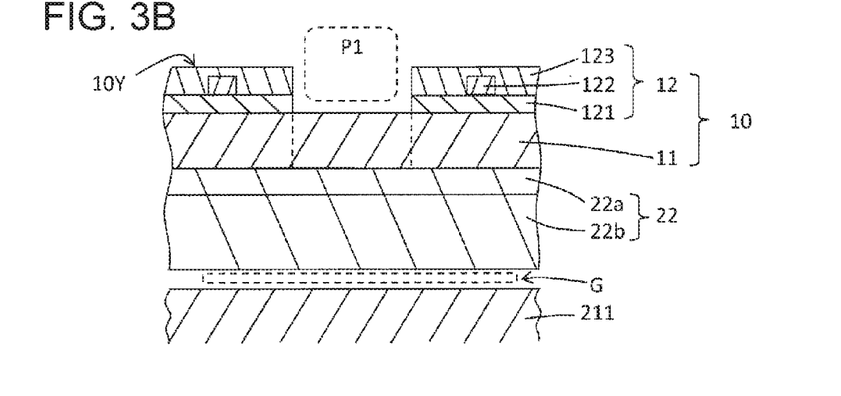
FIG. 3B is a sectional view illustrating some of the processes of the plasma treatment method according to the first exemplary embodiment.
Figure 3C:
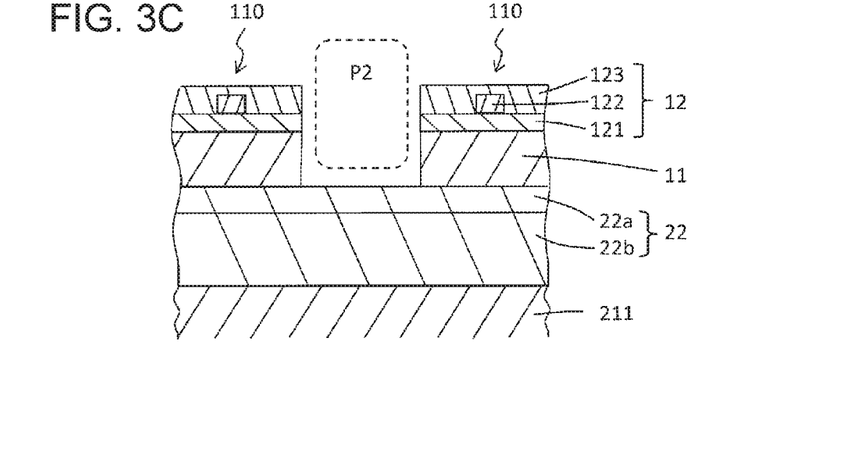
FIG. 3C is a sectional view illustrating some of the processes of the plasma treatment method according to the first exemplary embodiment.

A first exemplary embodiment will be described below with reference to FIGS. 3A to 3C. FIGS. 3A to 3C are sectional views illustrating a portion of the plasma treatment method in this exemplary embodiment. As illustrated in FIG. 3A, substrate 10 includes main body layer 11 and circuit layer 12. Main body layer 11 is a semiconductor layer. Circuit layer 12 includes multilayer wiring layer 121, electrode pad 122, and resist layer 123 for partially covering multilayer wiring layer 121. Resist layer 123 covers element region R2, and protects element region R2 from plasma. In other words, element region R2 is a region in which resist layer 123 is provided. Other regions correspond to isolation region R1. A portion of electrode pad 122 may be exposed from resist layer 123.

(1) Preparation Process

Firstly, transporting carrier 20 is prepared. Transporting carrier 20 is obtained in such a manner that holding sheet 22 is adhered to one surface of frame 21 so as to be fixed. At this time, as illustrated in FIG. 1B, adhesive layer 22a of holding sheet 22 is caused to face the frame. Then, main body layer 11 of substrate 10 is adhered to adhesive layer 22a of holding sheet 22, and thus substrate 10 is held by transporting carrier 20 (FIG. 3A). That is, in this exemplary embodiment, a surface (first main surface 10X) adhered to holding sheet 22 of substrate 10 corresponds to main body layer 11.

(2) Carrying-in Process

Then, transporting carrier 20 which holds substrate 10 is carried into vacuum chamber 203.

In vacuum chamber 203, driving the lifting rod 221 causes cover 224 to be lifted up to a predetermined position. A gate valve (not illustrated) is opened, and thus transporting carrier 20 is carried in. The plurality of supports 222 stands by in a up-lifted state. If transporting carrier 20 reaches the predetermined position over stage 211, transporting carrier 20 is delivered to support 222. Transporting carrier 20 is delivered to an upper end surface of support 222, so as to cause adhesive layer 22a of holding sheet 22 to be directly upwardly.

(3) Placing Process

If transporting carrier 20 is delivered to support 222, the gate valve is closed, and reaction chamber 103 is in a sealed state. Then, support 222 starts to be lifted down. The upper end surface of support 222 is lifted down up to a level (which is the same level as that of stage 211) or lower, and thus transporting carrier 20 is placed on stage 211. Subsequently lifting rod 221 drives. Lifting rod 221 lifts down cover 224 to a predetermined position. At this time, a distance between cover 224 and stage 211 is adjusted to cause cover 224 to cover frame 21 without coming into contact with transporting carrier 20. Thus, a portion which does not hold frame 21 and substrate 10 of holding sheet 22 is covered by cover 224 without coming into contact with cover 224, and substrate 10 is exposed from window portion 224W of cover 224.

Cover 224 has a toroidal shape which has a substantially circular external contour. Cover 224 has a constant width and a thin thickness. An inner diameter of cover 224 (diameter of window portion 224W) is smaller than an inner diameter of frame 21, and an outer diameter of cover 224 is larger than an outer diameter of frame 21. Thus, if transporting carrier 20 is mounted at the predetermined position of the stage, and cover 224 is lifted down, cover 224 may cover frame 21 and at least a portion of holding sheet 22. At least a portion of substrate 10 is exposed from window portion 224W. At this time, cover 224 comes into contact with none of frame 21, holding sheet 22, and substrate 10. Cover 224 is configured by a dielectric body such as ceramics (for example, alumina, aluminium nitride, and the like) or quartz, or by metal such as aluminium or aluminium having an alumite-treated surface.

Transporting carrier 20 is delivered to support 222, and then a voltage is applied to ESC electrode 219 from DC power source 226. Thus, if holding sheet 22 comes into contact with stage 211, simultaneously, holding sheet 22 is electrostatically sucked to stage 211. Applying a voltage to ESC electrode 219 may be started after holding sheet 22 is placed on stage 211 (after holding sheet 22 comes into contact with stage 211).

(4) Plasma Dicing Process (4-1) First Plasma Etching Process

In the first plasma etching process, etching is performed from second main surface 10Y side of substrate 10, and only a portion of the thickness of isolation region R1 (circuit layer 12 (multilayer wiring layer 121) in this exemplary embodiment) is removed by a physicochemical reaction with generated plasma P1 (FIG. 3B). At this time, cooling gas G is supplied between stage 211 and holding sheet 22. Thus, an increase of the temperature of holding sheet 22 in the first plasma etching process is suppressed. Cooling gas G is not particularly limited, and, for example, a heat transfer gas such as He is provided as cooling gas G.

Only a portion of the thickness of isolation region R1 is removed in the first plasma etching process. That is, substrate 10 has a thickness sufficient for maintaining a flat shape of substrate 10 in isolation region R1 during the first plasma etching process. Thus, even though cooling gas G is supplied between stage 211 and holding sheet 22, floating of substrate 10 from stage 211 is suppressed. Accordingly, the Coulomb force is generated between ESC electrode 219 (stage 211) and holding sheet 22 over the entire surface of substrate 10, and thus substrate 10 and holding sheet 22 are strongly electrostatically sucked to stage 211. Thus, a processed shape is stable, and an occurrence of a trouble such as abnormal discharge is suppressed.

In a case where stage 211 is cooled, thermal damage of substrate 10 and holding sheet 22 which are strongly electrostatically sucked to stage 211 is more suppressed. Thus, high frequency power of 100 kHz or higher (for example, 400 to 500 kHz, or 13.56 MHz) is applied to high-frequency electrode portion 220 buried in stage 211, and thus plasma etching may be performed with applying a high bias voltage. Accordingly, high-speed processing is enabled, and throughput is improved. Stage 211 is cooled in such a manner that coolant circulation device 225 circulates a coolant having a temperature of, for example, −20° C. to 20° C. in stage 211. Supplying cooling gas G and cooling stage 211 causes the temperature of holding sheet 22 in the plasma treatment to be suppressed to be equal to or lower than 70° C., for example.

In this exemplary embodiment, circuit layer 12 is removed in the first plasma etching process. However, it is not limited thereto. For example, in the first plasma etching process, only a portion of circuit layer 12 may be removed, or a portion of main body layer 11 may be removed along with circuit layer 12. Even in any case, in order to suppress floating of substrate 10 from stage 211 occurring by supplying cooling gas G between stage 211 and holding sheet 22, the first plasma etching process is preferably ended at a time point when the remaining thickness of isolation region R1 is larger than 20 μm, preferably at a time point when the remaining thickness of isolation region R1 is larger than 50 μm.

Figure 4:
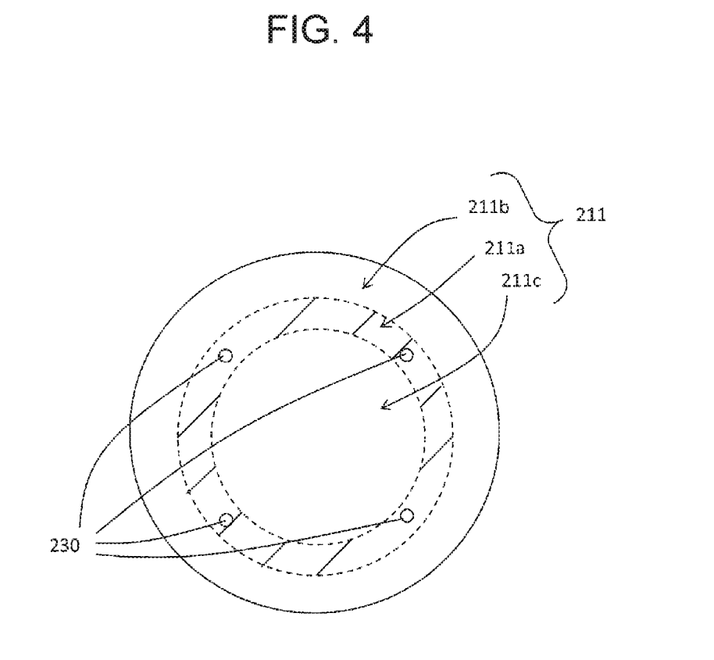
FIG. 4 is a top view illustrating disposition of a stage and a cooling gas hole of the plasma treatment apparatus.

Cooling gas G is supplied between stage 211 and holding sheet 22, from cooling gas hole 230 (see FIG. 2) disposed in the surface of stage 211. The position of cooling gas hole 230 is not particularly limited. Cooling gas hole 230 is preferably disposed at a position facing frame 21 on the surface of stage 211 (specifically, electrode layer 215). In this case, in the surface of stage 211 (surface on which transporting carrier 20 is placed), surface roughness of a ring-shaped region which includes cooling gas hole 230 is preferably set to be rough (that is, roughness is set to be large). Specifically, as illustrated in FIG. 4, stage 211 preferably includes first region 211a, second region 211b, and third region 211c. First region 211a is annular and includes cooling gas hole 230. Second region 211b has roughness smaller than that of first region 211a, and is formed around first region 211a. Third region 211c has roughness smaller than that of first region 211a, and is formed on an inner portion of first region 211a. The shape of first region 211a is not particularly limited. The shape of first region 211a is preferably a shape corresponding to the shape of frame 21, in a point that holding sheet 22 can be cooled with uniformity and high efficiency. At least a portion of second region 211b is preferably formed at a position facing frame 21. That is, frame 21 is preferably placed over first region 211a and second region 211b.

Cooling gas G supplied from cooling gas hole 230 firstly stays between first region 211a and holding sheet 22. Since the roughness of first region 211a is large, relatively large pores are formed between first region 211a and holding sheet 22. Thus, many of cooling gas G may stay between first region 211a and holding sheet 22. Further, the roughness of second region 211b formed around first region 211a is smaller, and thus adhesiveness between second region 211b and holding sheet 22 is high. Thus, cooling gas G leaking outwardly from first region 211a is difficult. That is, since the cooling gas flows toward third region 211c in the inner portion of first region 211a, holding sheet 22 may be cooled with high efficiency. Since the roughness of third region 211c is also smaller, adhesiveness between holding sheet 22 and third region 211c is also high. Thus, a cooling effect is more improved.

Roughness of each of regions 211a to 211c may be adjusted by polishing or plasma-processing the surface of stage 211. For example, the entirety of the surface of stage 211 is smoothly processed, and then a region corresponding to first region 211a is polished or plasma-processed. Thus, the roughness of this region can be increased. The roughness of each of regions 211a to 211c is not particularly limited.

For example, arithmetic average roughness Ra1 of first region 211a is preferably 1.6 to 2 µm. Arithmetic average roughness Ra2 of second region 211b is preferably 0.1 to 1.2 µm. Arithmetic average roughness Ra3 of third region 211c is preferably 0.1 to 1.2 µm.

The number of cooling gas holes 230 is not particularly limited, and a plurality of cooling gas holes 230 is preferably provided from a viewpoint of cooling holding sheet 22 with uniformity and high efficiency. In this case, cooling gas holes 230 are preferably disposed at a constant interval (for example, an interval of 5 to 100 mm, and preferably an interval of 30 to 70 mm) in the first region. The number of cooling gas holes 230 may be set in accordance with the diameter of frame 21. For example, in a case where the diameter of frame 21 is 300 mm, the number of cooling gas holes 230 is preferably 13 to 29. In a case where the diameter of frame 21 is 400 mm, the number of cooling gas holes 230 is preferably 17 to 41. The shape of cooling gas hole 230 is not particularly limited, and may be circular, oval, polygonal (square, hexagon, and the like).

The size of cooling gas hole 230 is more preferable as the size of cooling gas hole 230 becomes larger, from a viewpoint of cooling holding sheet 22 with high efficiency. If cooling gas hole 230 is too large, abnormal discharge easily occur in cooling gas hole 230 during the plasma treatment. Thus, regarding the size of cooling gas hole 230, the diameter of the equivalent circle having the same area is preferably, for example, 0.3 to 1.0 mm, and may be 0.5 to 0.8 mm. In particular, from a viewpoint of suppressing the occurrence of abnormal discharge, the size of cooling gas hole 230 may be reduced more (for example, 0.05 to 0.3 mm). In this case, in order to compensate with a decrease of the supplied amount of the cooling gas with a reduced diameter, the number of cooling gas holes 230 is preferably set to be much more.

Cooling gas hole 230 is connected to gas introduction path 231. In a case where a plurality of cooling gas holes 230 is provided, gas introduction path 231 may be divided, and all of cooling gas holes 230 may be connected to divided gas introduction path 231. Cooling gas G is supplied to gas introduction path 231 from cooling gas source 232. A manometer (not illustrated), a flow rate controller (not illustrated) for controlling a flow rate of cooling gas G, and the like may be connected to gas introduction path 231. For example, cooling gas G which has, for example, pressure of 30 to 2000 Pa and a flow rate of 1 to 100 sccm, and preferably pressure of 30 to 400 Pa and a flow rate of 1 to 20 sccm is supplied from gas introduction path 231. sccm is a unit of the flow rate. 1 sccm indicates the amount of a gas which is in a standard state (0° C., 1 atmosphere) and flows by 1 cm$^3$ for one minute.

Plasma P1 is generated as follows. Firstly, a process gas is introduced into the vacuum chamber 203 from process gas source 212 through gas introduction port 203a. Pressure reducing mechanism 214 exhausts the gas in vacuum chamber 203 from exhaust port 203b, so as to maintain pressure of vacuum chamber 203 to be predetermined pressure. Then, a high frequency power is applied to antenna 209 from first high-frequency power source 210A, and thus plasma P1 is generated in vacuum chamber 203. Generated plasma P1 is configured from ions, electrons, radicals, and the like.

The generation condition of plasma P1 is set in accordance with a material and the like of a layer to be etched (in this case, circuit layer 12). For example, in a case where multilayer wiring layer 121 containing a metal material is etched, plasma P1 is preferably generated by using a process gas containing argon (Ar) as a raw material. In this case, a physical action of plasma P1 causes ionic etching to be performed. At this time, as described above, it is preferable that high frequency power of 1000 to 5000 W which has a frequency of 13.56 MHz is supplied to the antenna 209 from first high-frequency power source 210A, and high frequency power of 100 kHz or higher (for example, 400 to 500 kHz, or 13.56 MHz) is supplied to high-frequency electrode portion 220 from second high-frequency power source 210B. The high frequency power is applied to high-frequency electrode portion 220, and thus a bias voltage is generated on the surface of stage 211. The generated bias voltage causes ions which are incident to substrate 10 to be accelerated, and the etching rate is increased.

In the first plasma etching process, etching is performed while cooling gas G is supplied between stage 211 and holding sheet 22. Thus, it is possible to apply high frequency power larger than high frequency power in a case of being applied to high-frequency electrode portion 220 in the second plasma etching process. For example, in a case where a gas mixture ($CF_4$:Ar=50:50) of $CF_4$ and Ar as a raw material gas is supplied at a rate of 150 to 250 sccm, pressure in the treatment chamber is adjusted to be 0.2 to 1.5 Pa. Plasma P1 may be generated under conditions that power applied to antenna 209 from first high-frequency power source 210A is set to be 1500 to 2500 W, and power applied to high-frequency electrode portion 220 from second high-frequency power source 210B is set to be 500 to 1800 W.

As described above, in the first plasma etching process, in a case where a portion of main body layer 11 is removed along with circuit layer 12, etching may be performed with replaced conditions. For example, after circuit layer 12 is removed by plasma which is generated by using a process gas containing Ar as a raw material, the conditions may be replaced with conditions for generating plasma P2 (which will be described later) (or by the Bosch process), and thus the portion of main body layer 11 may be removed.

(4-2) Second Plasma Etching Process

After the first plasma etching process, after the first plasma etching process, supplying cooling gas (U is stopped, and the remaining portion of isolation region R1 is subjected to plasma etching by plasma P2 (FIG. 3C). Thus, substrate 10 is divided, and a plurality of element chips 110 is held on holding sheet 22.

Conditions for generating plasma P2 are also set in accordance with a material and the like of a layer to be etched (in this case, main body layer 11). For example, in a case where main body layer 11 containing Si is etched, plasma P2 is preferably generated by using a process gas containing sulfur hexafluoride ($SF_6$) as a raw material. In this case, for example, pressure reducing mechanism 214 controls pressure of reaction chamber 103 to be 10 to 50 Pa while the $SF_6$ gas is supplied from process gas source 212 at a rate of 100 to 800 sccm.

In a case where main body layer 11 is a semiconductor layer formed of Si, the so-called Bosch process may be used for performing etching on main body layer 11 in a direction perpendicular to a depth direction. In the Bosch process, a protective-film accumulation step, a protective-film etching step, and a Si etching step are sequentially repeated, and thus main body layer 11 burrows in the depth direction.

The protective-film accumulation step is performed under the following conditions, for example. Pressure of the treatment chamber is adjusted to be 15 to 25 Pa while $C_4F_8$ as a raw material gas is supplied at a rate of 150 to 250 sccm. Power applied to antenna 209 from first high-frequency power source 210A is set to be 1500 to 2500 W, and power applied to high-frequency electrode portion 220 from second high-frequency power source 210B is set to be 0 to 50 W. Treatment is performed for a period of 2 to 15 seconds.

The protective-film etching step is performed under the following conditions, for example. Pressure of the treatment chamber is adjusted to be 5 to 15 Pa while SFr; as a raw material gas is supplied at a rate of 200 to 400 sccm. Power applied to antenna 209 from first high-frequency power source 210A is set to be 1500 to 2500 W, and power applied to high-frequency electrode portion 220 from second high-frequency power source 210B is set to be 300 to 1000 W. Treatment is performed for a period of 2 to 10 seconds.

The Si etching step is performed under the following conditions, for example. Pressure of the treatment chamber is adjusted to be 5 to 15 Pa while $SF_6$ as a raw material gas is supplied at a rate of 200 to 400 sccm. Power applied to antenna 209 from first high-frequency power source 210A is set to be 1500 to 2500 W, and power applied to high-frequency electrode portion 220 from second high-frequency power source 210B is set to be 50 to 500 W. Treatment is performed for a period of 10 to 20 seconds.

The protective-film accumulation step, the protective-film etching step, and the Si etching step are repeated under the conditions as described above, and thus main body layer 11 containing Si may be etched at a rate of 10 μm/minute in a direction perpendicular to the depth direction.

In the second plasma etching process, for example, main body layer 11 may be etched at a high speed, in a state of applying a bias voltage which is lower than that in the first plasma etching process. In other words, in the second plasma etching process, the power applied to high-frequency electrode portion 220 may be set to be smaller than the power applied to high-frequency electrode portion 220 in the first plasma etching process. Thus, cooling by cooling gas G is not required. That is, in the second plasma etching process, it is also possible to perform etching on main body layer 11 with high efficiency, under a condition which causes floating of substrate 10 from stage 211 not to occur. In a point that high-speed processing is allowed in the second plasma etching process, it is preferable that etching is performed so as to cause only main body layer 11 to remain, in the first plasma etching process. As described above, in the first plasma etching process, a portion of main body layer 11 may be removed along with circuit layer 12.

Even after supplying cooling gas G is stopped, it is preferable that a voltage is continuously applied to ESC electrode 219 from DC power source 226. Thus, a state where holding sheet 22 is electrostatically sucked to stage 211 is maintained. Accordingly, even after supplying cooling gas G is stopped, holding sheet 22 may be cooled by contact with stage 211. If applying a voltage to ESC electrode 219 from DC power source 226 is stopped just after supplying cooling gas G is stopped, the remaining pressure of cooling gas G which remains between holding sheet 22 and stage 211 may cause holding sheet 22 to float from stage 211. From this point, it is also preferable that the voltage is continuously applied to ESC electrode 219 from DC power source 226 even after supplying cooling gas G is stopped.

(4-3) Ashing Process

Substrate 10 is divided by the plasma dicing process, and then ashing is performed. A process gas for ashing (for example, an oxygen gas ($O_2$), or a gas mixture of $O_2$ and a gas containing fluorine) is introduced into vacuum chamber 203 from ashing gas source 213. Exhaust is performed by pressure reducing mechanism 214, and thus pressure of vacuum chamber 203 is maintained to be predetermined pressure. High frequency power is applied from first high-frequency power source 210A, and thus oxygen plasma is generated in vacuum chamber 203, and resist layer 123 on the surface of substrate 10 (element chip 110) which is exposed from window portion 224W of cover 224 and is divided is removed.

Ashing is performed under the following conditions, for example. Pressure of the treatment chamber is adjusted to be 5 to 15 Pa while a gas mixture ($CF_4O_2$=50:50) of $CF_4$ and $O_2$ as a raw material gas is supplied at a rate of 150 to 300 sccm. The power applied to antenna 209 from first high-frequency power source 210A is set to be 1500 to 2500 W, and the power applied to high-frequency electrode portion 220 from second high-frequency power source 210B is set to be 0 to 300 W. Power applied to high-frequency electrode portion 220 in the ashing process is desirably set to be smaller than power applied to high-frequency electrode portion 220 in the first plasma etching process. Thus, ashing is performed in a state of applying a bias voltage which is lower than that in the first plasma etching process. Thus, cooling by cooling gas G is not required.

(5) Carrying-Out Process

If ashing is ended, the gas in vacuum chamber 203 is exhausted, and the gate valve is opened. Transporting carrier 20 which holds a plurality of element chips 110 is carried out from plasma treatment apparatus 200 by a transporting mechanism which is entered from the gate valve. If transporting carrier 20 is carried out, the gate valve is rapidly closed. A carrying-out process of transporting carrier 20 may be performed in procedures reverse to the above-described procedures in which transporting carrier 20 is mounted on stage 211. That is, after cover 224 is lifted up to the predetermined position, a voltage applied to ESC electrode 229 is set to be zero. Sucking of transporting carrier 20 to the stage 211 is released, and support 222 is lifted up. After support 222 is lifted up to the predetermined position, transporting carrier 20 is carried out.

Second Exemplary Embodiment

Figure 5A:
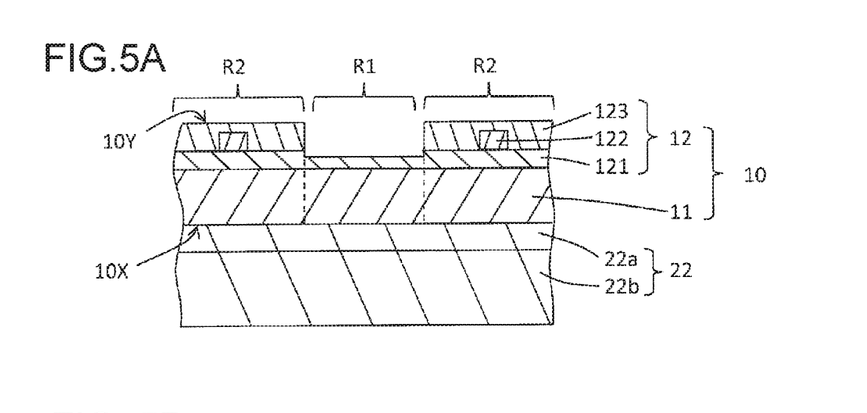
FIG. 5A is a sectional view illustrating some of processes of a plasma treatment method according to a second exemplary embodiment of the disclosure.
Figure 5B:
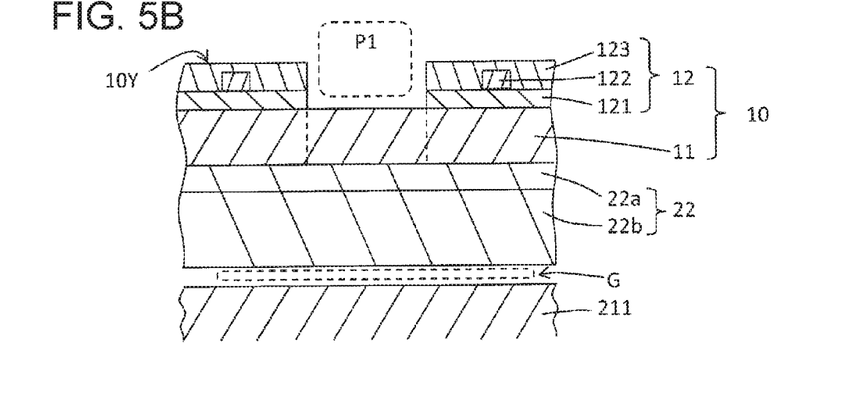
FIG. 5B is a sectional view illustrating some of the processes of the plasma treatment method according to the second exemplary embodiment of the disclosure.

As illustrated in FIG. 5A, this exemplary embodiment is similar to the first exemplary embodiment except that at least a portion of multilayer wiring layer 121 in isolation region R1 of substrate 10 provided in the first plasma etching process has been already removed. At least the portion of multilayer wiring layer 121 is removed, for example, by laser scribing processing or plasma etching processing, before the first plasma etching process. Even in this case, in the first plasma etching process (FIG. 5B), only the remaining portion of multilayer wiring layer 121 may be removed, or a portion of main body layer 11 may be removed along with the remaining portion of multilayer wiring layer 121.

Figure 5C:
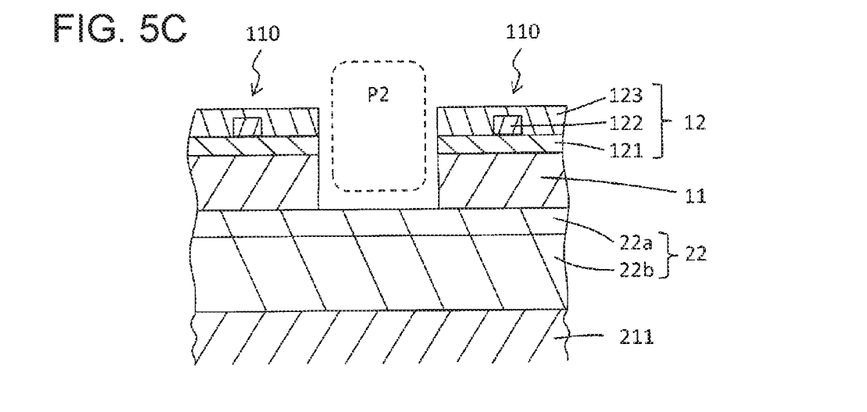
FIG. 5C is a sectional view illustrating some of the processes of the plasma treatment method according to the second exemplary embodiment of the disclosure.

In this exemplary embodiment, a portion of multilayer wiring layer 121 in isolation region R1 of substrate 10 provided in the first plasma etching process remains. However, the entirety of multilayer wiring layer 121 in isolation region R1 may be removed before the first plasma etching process. In this case, it is preferable that the first plasma etching process is ended at a time point when the remaining thickness of isolation region R1 (that is, main body layer 11) is larger than 20 μm, preferably at a time point when the remaining thickness of isolation region R1 is larger than 50 μm. This is because floating of substrate 10 from stage 211 occurring by cooling gas G is suppressed. After the first plasma etching process, similarly to the first exemplary embodiment, the second plasma etching process (FIG. 5C) is performed.

Third Exemplary Embodiment

Figure 6A:
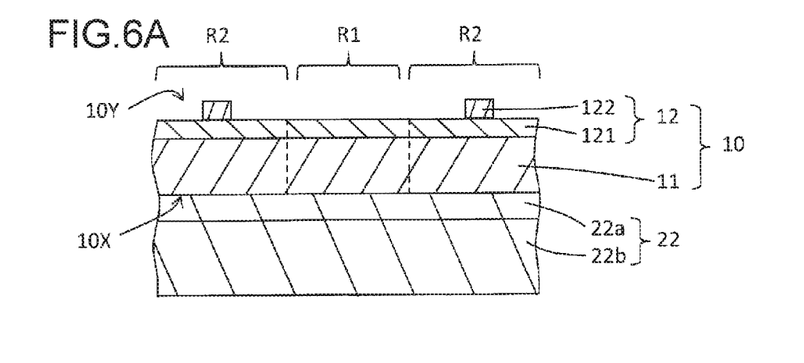
FIG. 6A is a sectional view illustrating some of processes of a plasma treatment method according to a third exemplary embodiment of the disclosure.
Figure 6B:
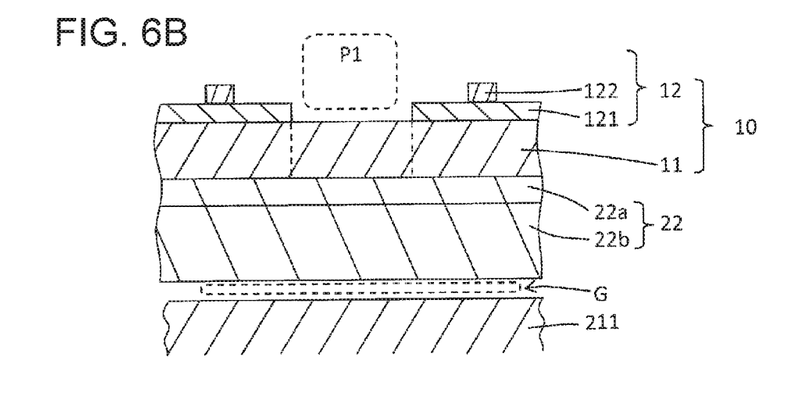
FIG. 6B is a sectional view illustrating some of the processes of the plasma treatment method according to the third exemplary embodiment of the disclosure.
Figure 6C:
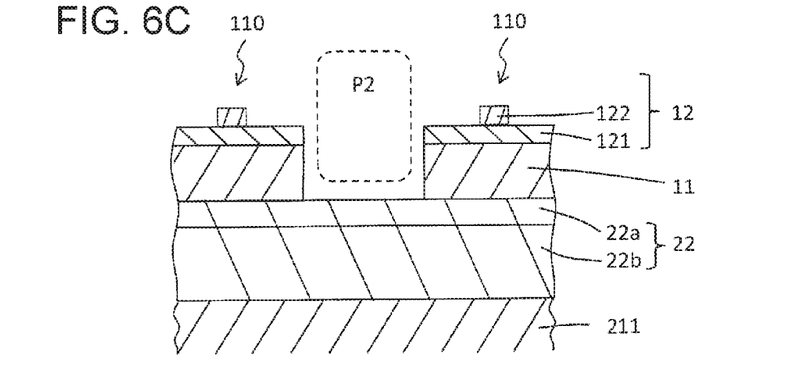
FIG. 6C is a sectional view illustrating some of the processes of the plasma treatment method according to the third exemplary embodiment of the disclosure.

As illustrated in FIG. 6A, this exemplary embodiment is similar to the first exemplary embodiment except that substrate 10 provided in the first plasma etching process does not include resist layer 123. Resist layer 123 may be removed, for example, before the first plasma etching process, and originally resist layer 123 may be not formed (maskless processing). Even in this case, in the first plasma etching process (FIG. 6B), only multilayer wiring layer 121 may be removed, or a portion of main body layer 11 may be removed along with multilayer wiring layer 121. In this case, as in the second exemplary embodiment, at least a portion of multilayer wiring layer 121 may be removed before the first plasma etching process. After the first plasma etching process, similarly to the first exemplary embodiment, the second plasma etching process (FIG. 6C) is performed.

In this exemplary embodiment, the first plasma etching process and the second plasma etching process are performed in a state where element region R2 is not protected by resist layer 123. Thus, in each of the etching processes, element region R2 may be also etched. The first plasma etching process and the second plasma etching process may be performed under a condition in which etching the surface of element region R2 is difficult. Thus, etching element region R2 is suppressed. In addition, for example, the degree of etching element region R2 by the first plasma etching process and the second plasma etching process under the above conditions may be recognized in advance, and designing may be performed so as to cause element region R2 to have a sufficient thickness.

Fourth Exemplary Embodiment

Figure 7A:
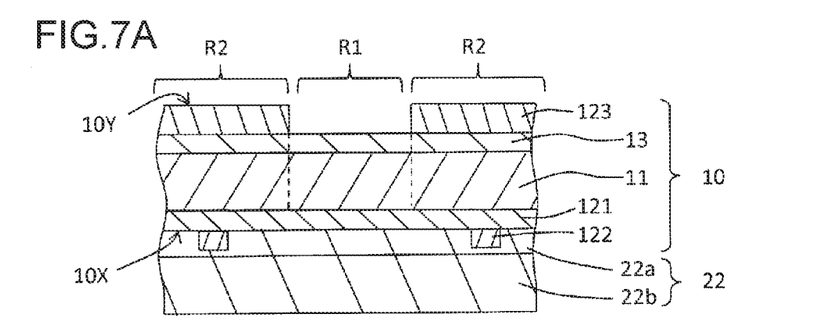
FIG. 7A is a sectional view illustrating some of processes of a plasma treatment method according to a fourth exemplary embodiment of the disclosure.

As illustrated in FIG. 7A, this exemplary embodiment is similar to the first exemplary embodiment except that substrate 10 provided in the first plasma etching process includes back metal layer 13 on an opposite side of multilayer wiring layer 121 of main body layer 11, and a surface (first main surface 10X) of substrate 10, which adheres to holding sheet 22 is a surface including electrode pad 122 of multilayer wiring layer 121. In this exemplary embodiment, resist layer 123 is disposed on the surface of back metal layer 13 on an opposite side of main body layer 11.

Figure 7B:
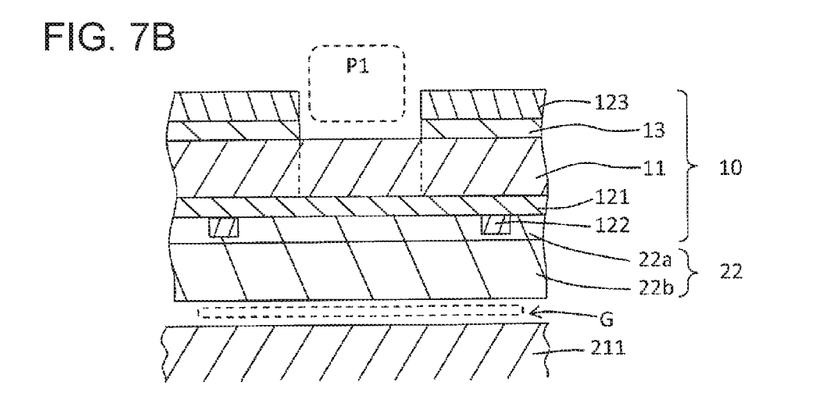
FIG. 7B is a sectional view illustrating some of the processes of the plasma treatment method according to the fourth exemplary embodiment of the disclosure.

In the first plasma etching process, at least back metal layer 13 is etched (FIG. 7B). Applying a high bias voltage is desired for performing plasma etching on back metal layer 13 without decreasing throughput. Here, because main body layer 11 and circuit layer 12 are disposed in isolation region R1 of substrate 10 during the first plasma etching process, substrate 10 holds a flat shape. Thus, it is possible to supply cooling gas G between stage 211 and holding sheet 22 while floating of substrate 10 from stage 211 is suppressed. Accordingly, an increase of the temperature of holding sheet 22 and substrate 10 is suppressed. That is, in the exemplary embodiment, the first plasma etching process can be performed while a high bias voltage is applied, and thus the throughput is improved.

In the first plasma etching process, the entirety of back metal layer 13 in isolation region R1 is preferably removed (FIG. 7B). This is for improving the throughput more. In the first plasma etching process, at least a portion of main body layer 11 may be removed along with back metal layer 13. In this case, in order to suppress floating of substrate 10 from stage 211, the first plasma etching process is preferably ended at a time point when the remaining thickness of isolation region R1 is larger than 20 μm, preferably at a time point when the remaining thickness of isolation region R1 is larger than 50 μm.

The first plasma etching process is performed by using plasma P1 which is generated, for example, by using a process gas containing Ar as a raw material. At this time, as described above, high frequency power of 100 kHz or higher (for example, 400 to 500 kHz, or 13.56 MHz) is applied to high-frequency electrode portion 220 from second high-frequency power source 210B, and thus a high bias voltage is applied. Specifically, plasma P1 may be generated under the following conditions. Pressure in the treatment chamber is adjusted to be 0.2 to 1.5 Pa while a gas mixture ($CF_4$: Ar=50:50) of $CF_4$ and Ar as a raw material gas is supplied at a rate of 150 to 250 sccm. Power applied to antenna 209 from first high-frequency power source 210A is set to be 1500 to 2500 W, and power applied to high-frequency electrode portion 220 from second high-frequency power source 210B is set to be 500 to 1800 W.

Figure 7C:
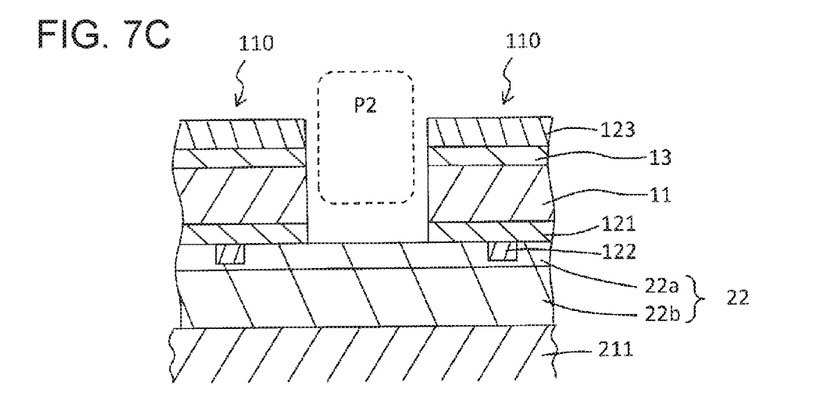
FIG. 7C is a sectional view illustrating some of the processes of the plasma treatment method according to the fourth exemplary embodiment of the disclosure.

In the second plasma etching process, the remaining portion (main body layer 11 and multilayer wiring layer 121 in FIG. 7C) of isolation region R1 is etched. Thus, substrate 10 is divided, and a plurality of element chips 110 is held on holding sheet 22. An etching condition of main body layer 11 may be different from an etching condition of multilayer wiring layer 121. For example, as described above, main body layer 11 may be removed by the Bosch process processing, and then multilayer wiring layer 121 may be removed by plasma which is generated by using a process gas containing Ar as a raw material.

Multilayer wiring layer 121 may be etched under the following conditions, for example. Pressure in the treatment chamber is adjusted to be 0.2 to 1.5 Pa while a gas mixture ($CF_4$:Ar=50:50) of $CF_4$ and Ar as a raw material gas is supplied at a rate of 150 to 250 sccm. Power applied to antenna 209 from first high-frequency power source 210A is set to be 1500 to 2500 W, and power applied to high-frequency electrode portion 220 from second high-frequency power source 210B is set to be 500 to 1000 W. In the second plasma etching process (in particular, removing multilayer wiring layer 121), supplying cooling gas G is stopped. Thus, it is preferable that applying a high bias voltage which, for example, causes an increase of the temperature is not performed.

Fifth Exemplary Embodiment

Figure 8A:
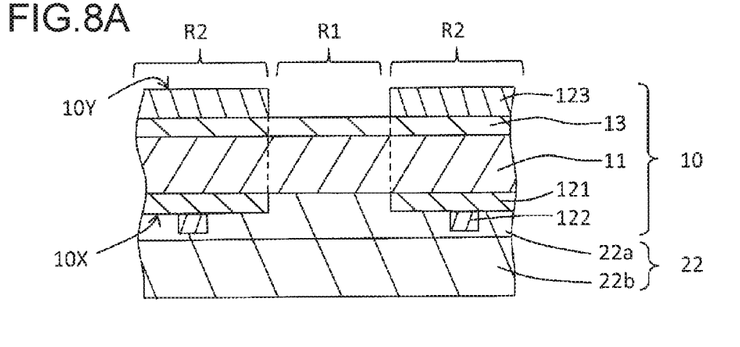
FIG. 8A is a sectional view illustrating some of processes of a plasma treatment method according to a fifth exemplary embodiment of the disclosure.
Figure 8B:
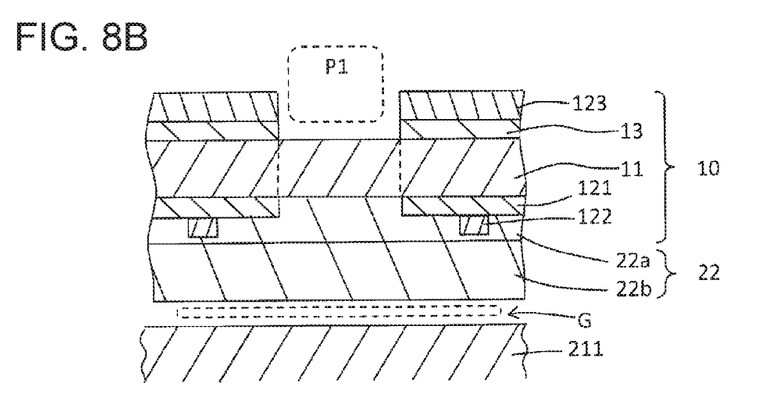
FIG. 8B is a sectional view illustrating some of the processes of the plasma treatment method according to the fifth exemplary embodiment of the disclosure.

As illustrated in FIG. 8A, this exemplary embodiment is similar to the fourth exemplary embodiment except that multilayer wiring layer 121 is not provided in isolation region R1 of substrate 10 provided in the first plasma etching process. Multilayer wiring layer 121 may be removed by laser scribing processing or plasma etching processing, before the first plasma etching process, or may originally be not formed in isolation region R1 by devising the layout. As illustrated in FIG. 8B, adhesive layer 22a of holding sheet 22 is preferably interposed between multilayer wiring layers 121 in adjacent element regions R2, in a state where substrate 10 is held by holding sheet 22. This is for improving a suction force of substrate 10 to stage 211.

Figure 8C:
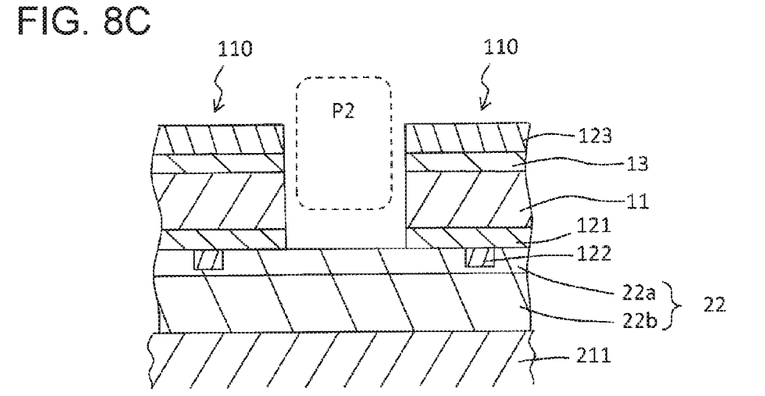
FIG. 8C is a sectional view illustrating some of the processes of the plasma treatment method according to the fifth exemplary embodiment of the disclosure.

From a viewpoint of improving throughput, in the first plasma etching process, it is preferable that the entirety of back metal layer 13 is removed in isolation region R1 (FIG. 8C). In this case, in the second plasma etching process, only main body layer 11 may be removed (FIG. 8C). Thus, even though applying a high bias voltage is not possible, it is possible to perform the Bosch process at a high speed. That is, cooling by cooling gas G is not required. That is, even in the second plasma etching process, it is possible to etching main body layer 11 with high efficiency, under a condition which causes floating of substrate 10 from stage 211 not to occur.

The manufacturing method according to the exemplary embodiments of the disclosure is advantageous as a method of manufacturing an element chip from a substrate which is held by the holding sheet and includes a circuit layer.

What is claimed is:

1. A manufacturing method of an element chip for forming a plurality of element chips by dividing a substrate by an isolation region, the substrate including a first main surface and a second main surface on an opposite side of the first main surface, and including a plurality of element regions demarcated by the isolation region, the method comprising:
   a preparation process of adhering a holding sheet to the first main surface so as to prepare a substrate held by the holding sheet;
   a placing process of placing the holding sheet which holds the substrate, on a stage provided in a plasma treatment apparatus; and
   a plasma dicing process of performing plasma etching on the isolation region from the second main surface to the first main surface so as to divide the substrate into the plurality of element chips,
   wherein the plasma dicing process includes
   a first plasma etching process of performing plasma etching on the isolation region partially in a thickness direction while a cooling gas is supplied between the stage and the holding sheet, and
   a second plasma etching process of stopping a supply of the cooling gas after the first plasma etching process, and performing plasma etching on a remaining portion of the isolation region while not supplying the cooling gas.

2. The manufacturing method of an element chip of claim 1, wherein
   the plasma dicing process is performed in a state where high frequency power is applied to the stage, and
   power applied to the stage in the first plasma etching process is higher than power applied to the stage in the second plasma etching process.

3. The manufacturing method of an element chip of claim 1, wherein
   the first plasma etching process is ended and the second plasma etching process is started at a time point when a remaining thickness of the isolation region is larger than 20 μm.

4. The manufacturing method of an element chip of claim 1,
   wherein in the preparation process, the holding sheet holding the substrate is fixed to a frame to form a transport carrier,
   wherein in the placing process, the transport carrier including the frame and the holding sheet which holds the substrate is placed on the stage, and
   wherein in the plasma dicing process, the cooling gas is supplied from a cooling gas hole disposed in a surface of the stage, the cooling gas hole being disposed at a position facing the frame placed on the stage.

5. The manufacturing method of an element chip of claim 1,
   wherein the substrate has a semiconductor layer in a side of the first main surface and a circuit layer in a side of the second main surface,
   wherein the circuit layer on the isolation region is removed by the first plasma etching process and at least a portion of the semiconductor layer is removed by the second plasma etching process.

6. The manufacturing method of an element chip of claim 1,
   wherein the stage includes an ESC electrode which is electrically connected to a DC power source,
   wherein during the first plasma etching process, a voltage is applied to the ESC electrode from the DC power source to electrically suck the substrate and the holding sheet to the stage, and
   wherein during the second plasma etching process, the voltage is continuously applied to the ESC electrode, after stopping the supply of the cooling gas.

* * * * *